(12) United States Patent
Kurita et al.

(10) Patent No.: US 9,458,538 B2
(45) Date of Patent: Oct. 4, 2016

(54) METHOD AND APPARATUS FOR SEALING AN OPENING OF A PROCESSING CHAMBER

(75) Inventors: Shinichi Kurita, San Jose, CA (US); Takayuki Matsumoto, San Jose, CA (US); Robin L. Tiner, Santa Cruz, CA (US); John M. White, Hayward, CA (US); Suhail Anwar, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 675 days.

(21) Appl. No.: 13/349,307

(22) Filed: Jan. 12, 2012

(65) Prior Publication Data

US 2012/0103989 A1     May 3, 2012

Related U.S. Application Data

(63) Continuation of application No. 12/252,055, filed on Oct. 15, 2008, now abandoned.

(60) Provisional application No. 60/984,478, filed on Nov. 1, 2007.

(51) Int. Cl.
*C23C 16/455* (2006.01)
*C23C 16/54* (2006.01)

(52) U.S. Cl.
CPC ......... *C23C 16/54* (2013.01); *C23C 16/45517* (2013.01)

(58) Field of Classification Search
CPC ...................... C23C 16/54; C23C 16/45517
See application file for complete search history.

(56) References Cited

U.S. PATENT DOCUMENTS

| 7,086,638 | B2 * | 8/2006 | Kurita et al. | 251/199 |
| 7,469,715 | B2 * | 12/2008 | Lee et al. | 137/554 |
| 2009/0114153 | A1 * | 5/2009 | Kurita et al. | 118/722 |

* cited by examiner

*Primary Examiner* — Dah-Wei D Yuan
*Assistant Examiner* — Stephen Kitt
(74) *Attorney, Agent, or Firm* — Patterson & Sheridan, LLP (57) ABSTRACT

A method and apparatus for sealing an opening of a processing chamber are provided. In one embodiment, the invention generally provides a closure member integrated within a wall of a process chamber for sealing an opening within the wall of the chamber. In another embodiment, the invention provides a closure member configured to seal an opening in the wall of a processing chamber from the inside of the chamber.

9 Claims, 7 Drawing Sheets

METHOD AND APPARATUS FOR SEALING AN OPENING OF A PROCESSING CHAMBER

CROSS-REFERENCE TO RELATED APPLICATIONS

This application is a continuation of U.S. patent application Ser. No. 12/252,055, filed on Oct. 15, 2008 now abandoned which claims benefit of the U.S. Provisional Patent Application Ser. No. 60/984,478, filed on Nov. 1, 2007, both of which are incorporated by reference in their entireties.

BACKGROUND OF THE INVENTION

1. Field of the Invention

Embodiments of the present invention generally relate to electronic device manufacturing and more particularly to methods and apparatus for improved sealing of an opening in a plasma processing chamber.

2. Description of the Related Art

In the fabrication of flat panel displays, television or computer monitors, solar cell arrays, and the like, various dielectric, semiconductive, and conductive layers are sequentially deposited on surfaces of substrates. These substrates may be made of glass, polymers, metal, or other suitable substrate materials capable of having electronic devices formed thereon. To increase fabrication efficiency and/or lower production costs, the size of the substrates to be processed continues to increase. As a result, the size of processing chambers for forming the layers on the surface of the substrates continues to increase as well.

A substrate processing chamber typically communicates with a substrate transfer chamber through a sealable opening that is both wide and relatively short to accommodate insertion and removal of horizontally-oriented substrates. A chamber isolation valve, also known as a slit valve, may be positioned adjacent the processing chamber to seal such an opening.

For example, an isolation valve may be attached to the processing chamber such that a sealing plate, also known as a door, of the isolation valve may be extended to seal the opening, and retracted to permit passage of substrates through the opening.

Unfortunately, as the size of the substrates, and corresponding size of the needed opening in the process chamber, continues to grow, so do problems associated with current sealing systems associated with plasma uniformity, gas flow, particle contamination, and temperature uniformity. Accordingly, a need exists for improved methods and apparatus for sealing the opening of a process chamber.

SUMMARY OF THE INVENTION

Embodiments of the present invention generally provide an improved method and apparatus for sealing an opening of a processing chamber, which may be used in a cluster-type substrate processing system.

In one embodiment of the present invention, an apparatus for sealing an opening in a wall of a processing chamber comprises a closure member at least partially disposed between a front plate adjacent a processing volume and a rear plate of the wall, a conductive bumper disposed between the closure member and the front plate of the wall, and a deployment mechanism configured to move the closure member both vertically and horizontally with respect to the opening. In one embodiment, the closure member has an extended portion extending vertically away from the opening.

In another embodiment, a method for sealing an opening in a wall of a processing chamber comprises activating a deployment mechanism to move an enclosure member that is at least partially disposed between a front plate and a rear plate of the wall with respect to the opening via an extended portion of the closure member and moving the door member into contact with the front plate to seal the opening in the chamber wall. In one embodiment, the closure member has a door member and a bracing member.

In another embodiment, a processing chamber comprises a wall having a front plate adjacent a processing volume, a rear plate, and an opening extending therethrough, a closure member configured between the front plate and the rear plate, and a deployment mechanism configured to move the closure member with respect to the opening.

In another embodiment of the present invention, a processing chamber comprises a chamber body having a bottom and a wall with an opening extending therethrough, a closure member disposed within the chamber body, and a deployment mechanism configured to move the closure member with respect to the opening. In one embodiment, the closure member has at least one electrically conductive sealing member disposed thereon.

In yet another embodiment of the present invention, a method for sealing an opening in a wall of a processing chamber comprises activating a deployment mechanism to move an enclosure member that is disposed within the processing chamber with respect to the opening via an extended portion of the closure member, moving a door member of the closure member that is enclosed within the processing chamber into contact with the wall to seal the opening in the chamber wall, and establishing electrical contact between the door member and the chamber wall.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention generally comprise an improved method and apparatus for sealing an opening of a processing chamber, which may be used in a cluster-type substrate processing system.

Figure 1:
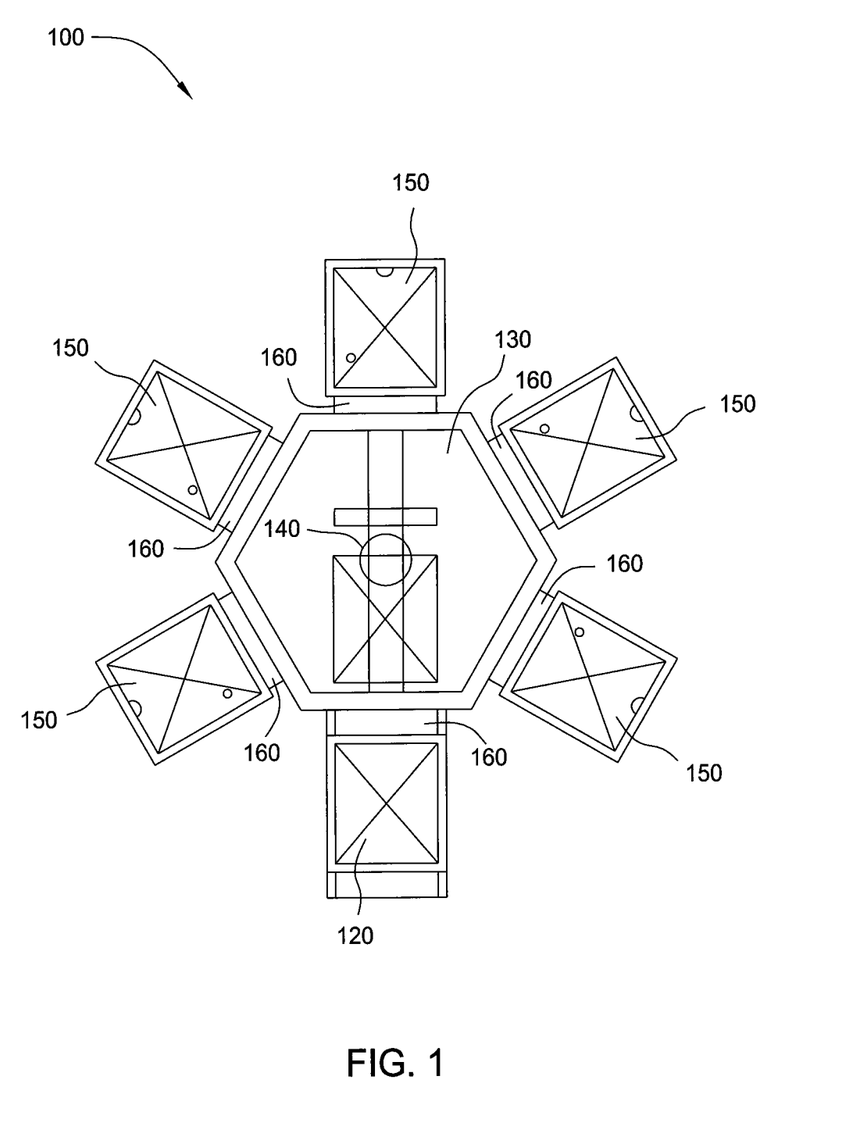
FIG. 1 is a schematic plan view of an exemplary substrate processing system that may be adapted to benefit from the invention.

FIG. 1 is a schematic plan view of an exemplary substrate processing system 100 that may be adapted to benefit from the invention. The substrate processing system 100 may include a load lock 120, a transfer chamber 130, a transfer robot 140, and multiple substrate processing chambers 150.

The load lock 120 allows the introduction of one or more substrates into the vacuum environment of the substrate processing system 100 without pressurizing the entire system to atmospheric pressure.

Substrates are processed in the processing chambers 150. The processing chambers 150 may be plasma-enhanced chemical vapor deposition (PECVD) chambers. The substrate processing chambers 150 may be other types of processing chambers as well, such as physical vapor deposition (PVD) chambers. Typically, the substrate processing chambers 150 are isolated from each other to minimize infiltration of incompatible process gases and because different processes may require significantly different levels of vacuum.

The transfer robot 140, inside the transfer chamber 130, transfers substrates between the substrate processing chambers 150 and the load lock 120. Each chamber 150 of the substrate processing system 100 may be isolated from all other chambers by one or more chamber isolation valves 160. These chamber isolation valves 160 are positioned between the transfer chamber 130 and the associated process chamber 150 or load lock chamber 120.

Figure 2A:
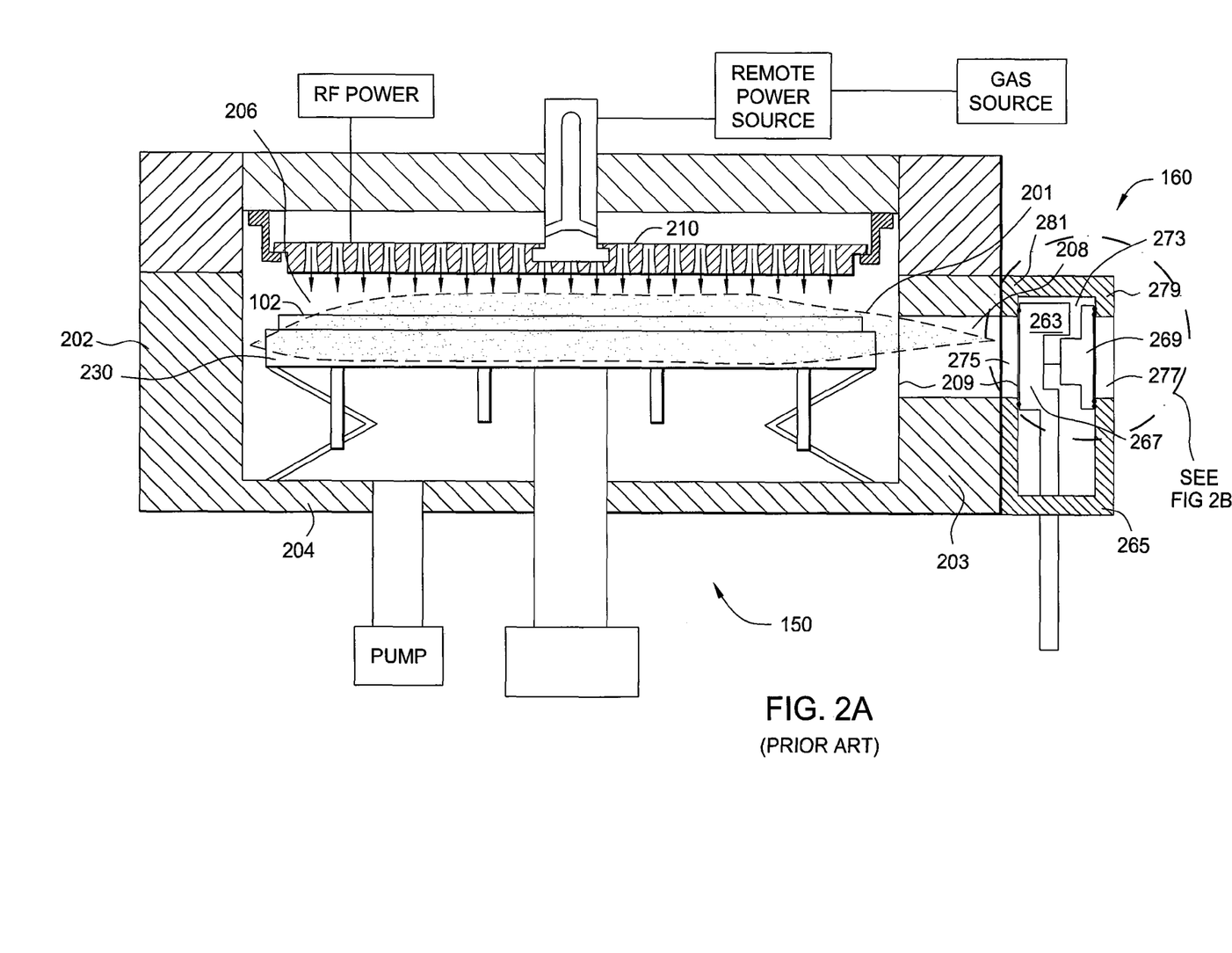
FIG. 2A is a schematic cross-section view of a prior art processing chamber, with plasma generated therein, positioned adjacent an associated chamber isolation valve.
Figure 2B:
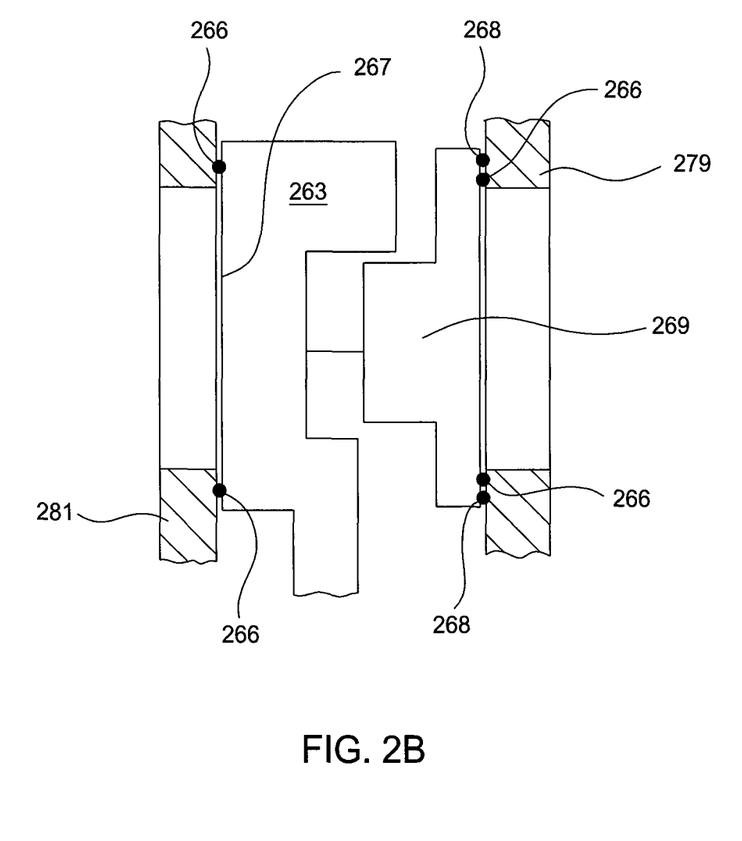
FIG. 2B is a partial, enlarged view of the chamber isolation valve of FIG. 2A.

FIG. 2A is a schematic cross-section view of one embodiment of a processing chamber, such as the processing chamber 150 positioned adjacent the associated chamber isolation valve 160. For example, processing chamber 150 may be a plasma enhanced chemical vapor deposition (PECVD) chamber. One suitable plasma enhanced chemical vapor deposition chamber is available from Applied Materials, Inc., located in Santa Clara, Calif. FIG. 2B is a partial, enlarged view of the chamber isolation valve 160.

The chamber 150 generally includes walls 202, a wall 203, a bottom 204, a showerhead 210, and a substrate support 230, which cumulatively define a process volume 206. The process volume 206 is accessed through an opening 208 such that a substrate 102 may be transferred into and out of the chamber 150. The chamber isolation valve 160 is placed adjacent the chamber 150 to allow access to the opening 208 when a substrate is being transferred and to seal the opening 208 when a substrate is not being transferred. This placement creates an elongated tunnel 209 associated with the chamber opening 208 and the chamber isolation valve 160. In typical chamber configurations, the length of the elongated tunnel 209 may be about 20 cm or greater.

The chamber isolation valve 160 seals the opening 208 to the adjacent processing chamber 150 so as to permit pressurization of the processing chamber 150 for processing of a substrate contained therein. Conventional chamber isolation valves typically are not designed to accommodate the large pressure differentials associated with the plasma-processing of large substrates, such as flat panels. An improved apparatus and method has been developed incorporating a moveable bracing member into the chamber isolation valve which exerts a supportive bracing force on the isolation valve door when closed. The method and apparatus incorporating a bracing member and bracing force into a chamber isolation valve are discussed in detail below and in U.S. Pat. No. 7,086,638 issued Aug. 8, 2006 to Kurita et al., which is incorporated by reference to the extent not inconsistent with the present disclosure.

Referring to FIGS. 2A and 2B, the chamber isolation valve 160 may include a closure member 263 for sealing the chamber opening 208. The chamber isolation valve 160 may also include a valve housing 265 within which at least a portion of the closure member 263 may be movably disposed. To permit the chamber isolation valve 160 to be used in conjunction with the opening 208 of the processing chamber 150, the valve housing 265 of the chamber isolation valve 160 may be placed against the processing chamber 150, such that a seal is formed between the valve housing 265 and the processing chamber 160, at the opening 208 to be sealed.

The closure member 263 may include a chamber isolation valve door 267 for sealing the chamber opening 208. The closure member 263 may further include a bracing member 269 that is movable relative to chamber isolation valve door 267. For example, the bracing member 269 may be adapted to extend away from and retract toward the chamber isolation valve door 267. Further, the bracing member 269 may be adapted to brace or buttress the chamber isolation valve door 267, for example, when the chamber isolation valve door 267 is in position to seal the chamber opening 208 as described above.

The valve housing 265 may define an enclosure 273, a first opening 275 to the enclosure 273, and a second opening 277 to the enclosure 273. The first opening 275 may be adjacent and allow access to the interior of the transfer chamber 150. As shown in FIG. 2, the second opening 277 and the enclosure 273 are aligned along a common axis with the first opening 275 and the chamber opening 208, and are sized to permit passage of substrates through the valve housing 265 and into and out of the processing chamber 150 when the closure member 263 is in the open position. The first opening 275 correspondingly forms an extension of the elongated tunnel 209.

In embodiments of the chamber isolation valve 160 intended for sealing a processing chamber in the presence of a large pressure differential, the valve housing 265 may further include a rear plate 279 within which the second opening 277 is formed. The rear plate 279 may be adapted to permit the bracing member 269 to contact the rear plate 279 and push against the rear plate 279 for bracing the chamber isolation valve door 267 of the closure member 263 during sealing. An elastomeric o-ring 266 may be disposed between the bracing member 269 and the rear plate 279 to provide a pressure tight seal between the bracing member 269 and the rear plate 279. In addition, a conductive bumper 268 may be disposed between the bracing member 269 and the rear plate 279 as well. The valve housing 265 may further comprise a front plate 281, within which the first opening 275 is formed. The front plate 281 may be adapted to permit the chamber isolation valve door 267 of the closure member 263 to contact the front plate 281 and seal around the first opening 275. The valve door 267 may include the o-ring 266 to provide a pressure seal between the valve door 267 and the front plate 281 of the valve housing 265.

FIGS. 2A and 2B further show a schematic cross-sectional representation of plasma 201 generated by a processing chamber 150 positioned adjacent an isolation valve 160.

A radio frequency (RF) return path is established along the interior surfaces of the processing chamber 150, which contains the plasma 201 during processing. Accordingly, an RF return path may be established through the isolation valve 160 to contain the plasma 201 at the opening 208. This return path may be established between the isolation valve housing 265 and the processing chamber wall 203 via conductive contact. Additionally, the return path may be continued across the second opening 277 of the isolation valve 160 via conductive contact between the bracing member 269 and the valve housing 265 provided through the conductive bumper 268.

However, although the plasma 201 may be substantially contained, problems associated with this configuration exist. First, as shown in FIG. 2, the plasma 201 generated is not uniform about the substrate 102. In fact, because of the length of elongated tunnel 209 created at the opening 208, the plasma 201 extends a significant distance into the opening 208. This occurs because of the significant distance that the plasma 201 may travel to reach the above referenced containment of isolation valve 160. This non-uniform plasma generation results in substantial, non-uniform deposition on the substrate 102.

Additionally, the gas flow in the process chamber 150 is inhibited at the opening 208, due to the tendency of gas to get trapped in the elongated tunnel 209 associated with the chamber opening 208. This "tunneling effect" at the chamber opening 208 also appears to lead to a non-uniform temperature distribution along the processing chamber wall 203 on which the opening 208 is located. Both of these situations also contribute to non-uniform deposition of material onto the substrate 102.

Another problem associated with the previous configuration is the production of residual process film in the elongated tunnel 209 at the chamber opening 208. This excess of residual process film in the elongated tunnel 209 leads to excess material deposition on the chamber surfaces in the tunnel 209. Correspondingly, these deposits may flake off onto the substrate 102 during transfer, resulting in contamination of the substrate 102.

Figure 3A:
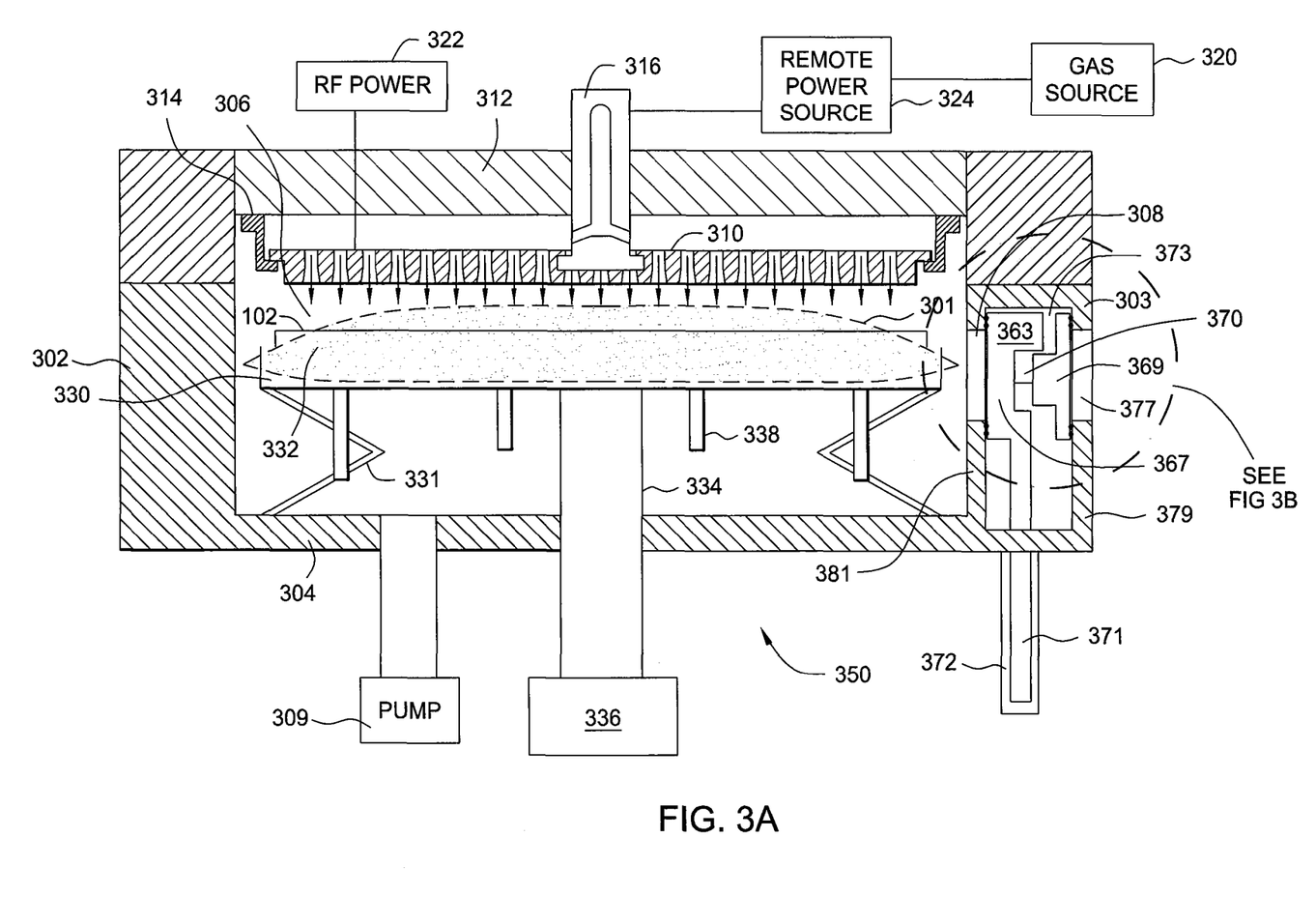
FIG. 3A is a schematic cross-section view of a processing chamber according to one embodiment of the invention with plasma generated therein.

In contrast, embodiments of the present invention significantly improve on the aforementioned configuration by shortening the distance to the RF return path of the isolation valve 160 through the elimination of the elongated tunnel 209 at opening 208. FIG. 3A shows one embodiment of the present invention represented by a schematic cross-section of a processing chamber 350 generating plasma 301.

Similar to the previously described chamber 150, the processing chamber 350 generally includes walls 302, a wall 303, a bottom 304, a showerhead 310, and a substrate support 330, which cumulatively define a process volume 306. The substrate support 330 may include a substrate receiving surface 332 for supporting the substrate 102 and stem 334 coupled to a lift system 336 to raise and lower the substrate support 330. Lift pins 338 may be moveably disposed through the substrate support 330 to move the substrate 102 to and from the substrate receiving surface 332. The substrate support 330 may also include RF return straps 331 to provide an RF path between the periphery of the substrate support 330 and the walls 302, which shortens the RF return path to an RF power source 322. Examples of RF return straps are disclosed in U.S. Pat. No. 6,024,044 issued on Feb. 15, 2000 to Law et al. and U.S. patent application Ser. No. 11/613,934 filed on Dec. 20, 2006 to Park et al., which are both incorporated by reference in their entirety to the extent not inconsistent with the present disclosure.

The showerhead 310 may be coupled to a backing plate 312 at its periphery by a suspension 314. The showerhead 310 may also be coupled to the backing plate 312 by one or more center supports 316 to help prevent sag and/or control the straightness/curvature of the showerhead 310. A gas source 320 may be coupled to the backing plate 312 to provide gas through the backing plate 312 and through the showerhead 310 to the substrate receiving surface 332. A vacuum pump 309 may be coupled to the chamber 350 to control the process volume 306 at a desired pressure. Then RF power source 322 may be coupled to the backing plate 312 and/or to the showerhead 310 to provide an RF power to the showerhead 310 so that an electric field is created between the showerhead and the substrate support so that plasma may be generated from the gases between the showerhead 310 and the substrate support 330. Various RF frequencies may be used, such as a frequency between about 0.3 MHz and about 200 MHz. In one embodiment the RF power source is provided at a frequency of 13.56 MHz. Examples of showerheads are disclosed in U.S. Pat. No. 6,477,980 issued on Nov. 12, 2002 to White et al., U.S. Publication 2005/0251990 published on Nov. 17, 2006 to Choi et al., and U.S. Publication 2006/0060138 published on Mar. 23, 2006 to Keller et al., which are all incorporated by reference in their entirety to the extent not inconsistent with the present disclosure.

A remote plasma source 324, such as an inductively coupled remote plasma source, may also be coupled between the gas source 320 and the backing plate 312. Between processing substrates, a cleaning gas may be provided to the remote plasma source 324 so that remote plasma is generated and provided to clean chamber components. The cleaning gas may be further excited by the RF power source 322 provided to the showerhead. Suitable cleaning gases include, but are not limited to $NF_3$, $F_2$, and $SF_6$. Examples of remote plasma sources are disclosed in U.S. Pat. No. 5,788,778 issued Aug. 4, 1998 to Shang et al., which is incorporated by reference to the extent not inconsistent with the present disclosure.

Similar to the embodiment shown in FIG. 2A, the process volume 306 is accessed through an opening 308 in the chamber wall 303 such that the substrate 102 may be transferred into and out of the chamber 350. However, contrary to prior configurations, the chamber wall 303 may be configured to integrally allow access to the opening 308 when a substrate is being transferred and to seal the opening 308 when a substrate is not being transferred.

Figure 3B:
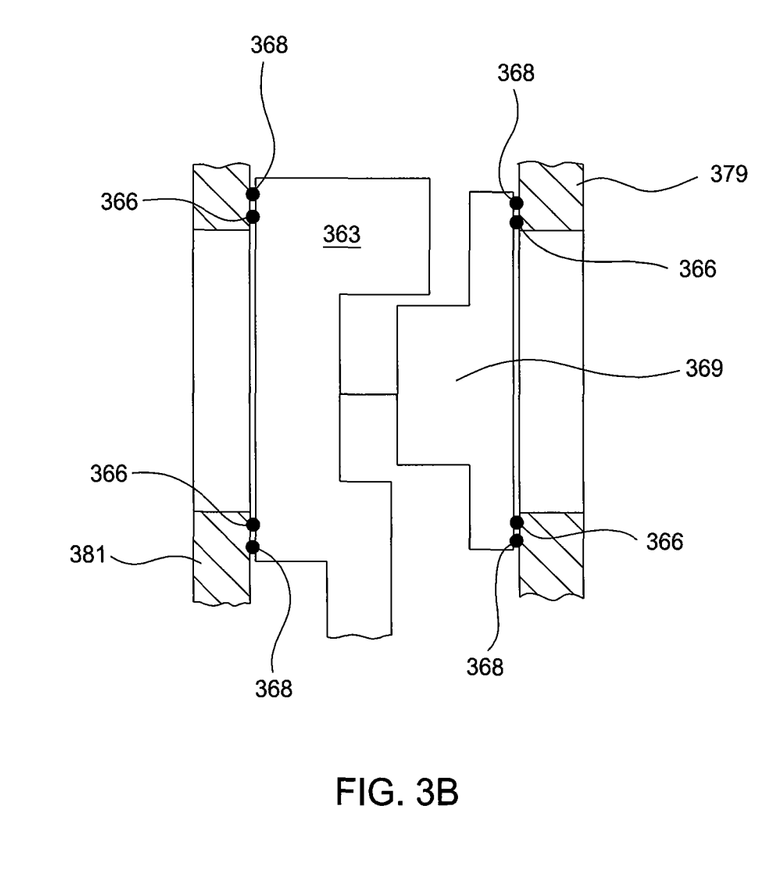
FIG. 3B is a partial, enlarged view of a wall of the chamber of FIG. 3A.

FIG. 3B is a partial, enlarged view of the chamber wall 303 according to one embodiment of the present invention. Referring to FIGS. 3A and 3B, the chamber wall 303 may comprise a front plate 381 and a rear plate 379 between which at least a portion of a closure member 363 may be movably disposed for sealing the chamber opening 308. The closure member 363 may include a door 367 for sealing the chamber opening 308. The door 367 may include a resilient member 366 for maintaining a pressure tight seal at the chamber opening 308. The resilient member 366 may comprise an elastomeric material, such as a silicone-based elastomer. Additionally, the door 367 may include a conductive bumper 368, which may be comprised of electrically conductive elastomeric materials such as a metal impregnated silicone-based elastomer. Alternatively, the conductive bumper 368 may be a metal bumper comprising aluminum plated stainless steel, high nickel alloy steel, chromium-nickel alloy steel, or the like. Alternatively, the front plate 381 may include the resilient member 366 and/or the conductive bumper 368.

The closure member 363 may further include a bracing member 369 that is movable relative to the door 367. For example, the bracing member 369 may be adapted to extend away from and retract toward the door 367. Further, the bracing member 369 may be adapted to brace or buttress the door 367, for example, when the door 367 is in position to seal the chamber opening 308. Additionally, the bracing member 369 may include the resilient member 366 for maintaining a pressure tight seal. Moreover, the bracing member 369 may include the conductive member 368 as well. Alternatively, the rear plate 379 may include the resilient member 366 and/or the conductive member 368.

To provide for movement of the closure member 363 relative to the chamber opening 308, the closure member 363 may also include an extended portion 371 that is spaced away from the door 367. In such an embodiment, an end of the extended portion 371 that is spaced away from the door 367 may be manipulated by a deployment mechanism 372 disposed inside or outside of the chamber wall 303. The deployment mechanism 372 may be a combination of pneumatically-driven linear actuators The deployment mechanism 372 may move the closure member 363 as a unit, i.e., by moving both the chamber isolation valve door 367 and the bracing member 369 together via the extended portion 371. For example, the deployment mechanism 372 may move the closure member 363 horizontally via extended portion 371 toward and/or away from the chamber opening 308. Additionally, the deployment mechanism 372 may move the closure member 363 vertically via extended portion 371.

The processing chamber wall 303 may define an enclosure 373. The chamber opening 308 contained in the front plate 381 allows access between the processing volume 306 and the enclosure 373. A second chamber opening 377 allows access between the enclosure 373 and a transfer chamber, such as the transfer chamber 130 in FIG. 1. As shown in FIG. 3, the second chamber opening 377 and the enclosure 373 are aligned along a common axis with the chamber opening 308, and are sized to permit passage of substrates through the chamber wall 303 and into and out of the processing chamber 350 when the closure member 363 is in the open position.

In embodiments of the chamber wall 303 intended for sealing a processing chamber in the presence of a large pressure differential, the rear plate 379 may be adapted to permit the bracing member 369 to contact the rear plate 379 and push against the rear plate 379 for bracing the valve door 367 of the closure member 363 during sealing. The front plate 381 may be adapted to permit the door 367 of the closure member 363 to contact the front plate 381 and seal around the chamber opening 308.

To provide for movement of the bracing member 369 relative to the door member 367, an actuator 370 may be employed within the bracing member 369 and/or the door member 367. The actuator 370 may be a pneumatic actuator having a pressure cell that may be expanded via an external source of pressurized gas to force the bracing member 369 against the rear plate 379.

The chamber bottom 304, walls 302, and wall 303 provide an RF return path, which contains the plasma 301. Additionally, the RF return path may be continued across the chamber opening 308 of the chamber wall 303 via conductive contact between the door member 367 and the front plate 381 provided by the conductive bumper 368. This configuration may result in a significantly shorter RF return path for containing plasma 301 at the chamber opening 308 than the configuration in prior embodiments, such as that shown in FIG. 2 for containing plasma 201 about the corresponding chamber opening 208. Preferably, the distance between the interior chamber surface of front plate 381 and the door member 367 is about 10 cm or less.

Figure 4:
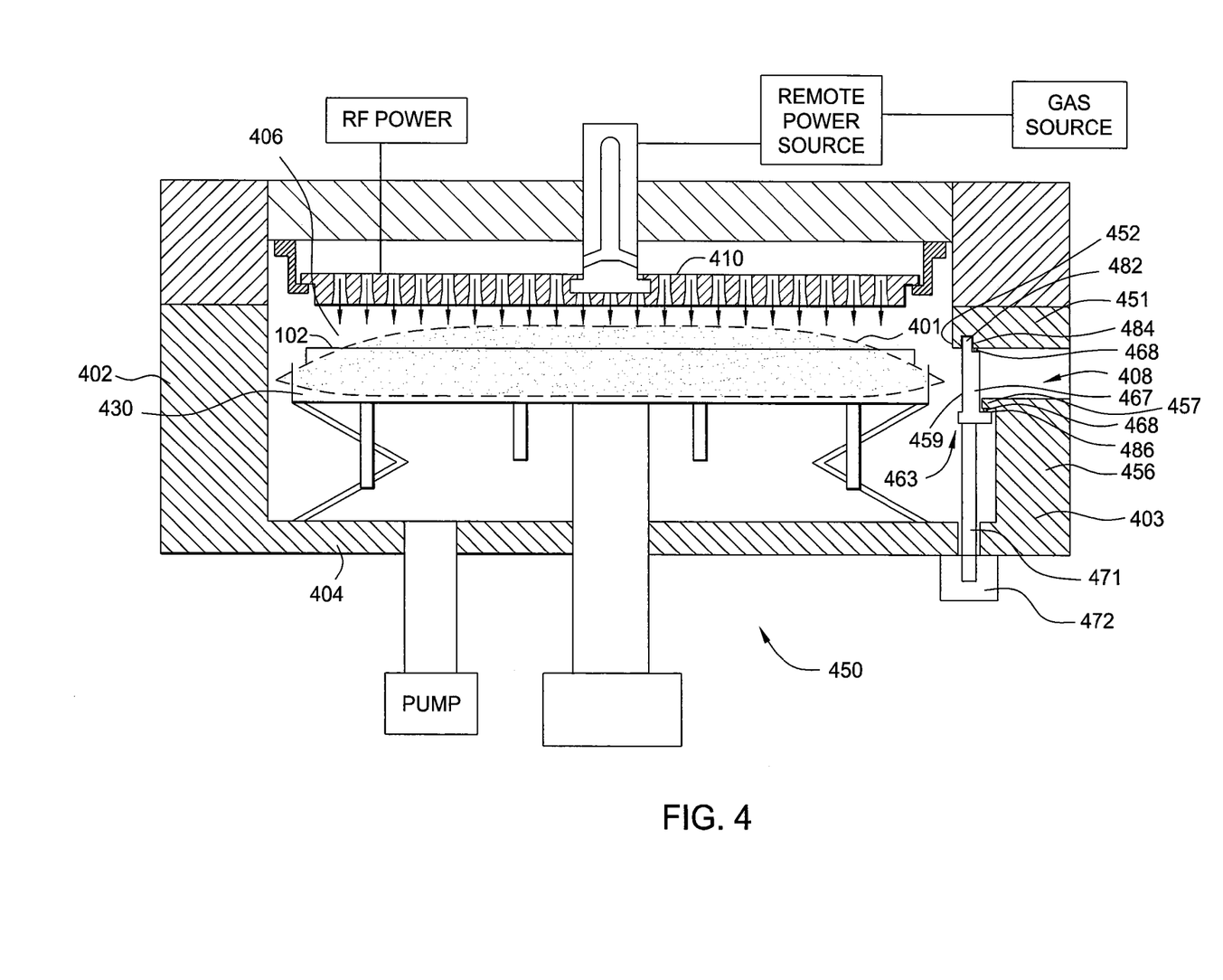
FIG. 4 is a schematic cross-section view of a processing chamber according to another embodiment of the present invention with plasma generated therein.

FIG. 4 depicts another embodiment of the present invention represented by a schematic cross-section of a processing chamber 450 generating plasma 401. Similar to the previously described chambers, the processing chamber 450 includes walls 402, a wall 403, a bottom 404, a showerhead 410, and a substrate support 430, which cumulatively define a process volume 406. Also, similar to the previous embodiment, the process volume 406 is accessed through an opening 408 in the chamber wall 403 such that the substrate 102 may be transferred into and out of the chamber 450. However, contrary to prior configurations, a closure member 463 is configured to allow access to the opening 408 when a substrate is being transferred and to seal the opening 408 from the interior of the chamber 450 when a substrate is being processed.

In one embodiment, the closure member 463 includes a door 467 and an extended portion 471 that is spaced away from the door 467. In such an embodiment, an end of the extended portion 471 that is spaced away from the door 467 may be manipulated by a deployment mechanism 472 disposed below the chamber bottom 404. The deployment mechanism 472 may move the closure member 463 vertically via the extended portion 471.

In one embodiment, the door 467 includes an upper surface with a tongue member 482, a first recessed portion 484 and a second recessed portion 486. The first recessed portion 484 and the second recessed portion 486 may each further comprise a resilient member 468 disposed thereon for maintaining a vacuum seal at the chamber opening 408. The resilient member 468 may be comprised of electrically conductive elastomeric materials such as a metal impregnated silicone-based elastomer. Alternatively, the resilient member 468 may be a bumper comprising aluminum plated stainless steel, high nickel alloy steel, chromium-nickel alloy steel, or the like.

In one embodiment, the wall 403 includes an upper portion 451 disposed above the opening 408 and a lower portion 456 disposed below the opening 408. The upper portion 451 may include a groove 452 disposed therein. The lower portion 456 may include a lip 457.

In one embodiment, the tongue member 482 is inserted into the groove 452 when the door 467 is in the closed position for sealing the opening 408. Additionally, the resilient member 468 disposed on the first recessed portion 484 of the door 467 may contact the upper portion 451, and the resilient member 468 disposed on the second recessed portion 486 of the door 467 may contact the lip 457 of the lower portion 456 of the wall 403 when the door 467 is in its closed position for sealing the opening 408.

Such a configuration establishes a labyrinth seal of the door 467 to the wall 403. That is, the "tongue and groove" arrangement of the upper surface of the door 467 to the upper portion 451 of the wall 403 results in a long and difficult path for any excited gas to travel to reach the sealed surfaces about the opening 408. This prevents the electrical contact area between the door 467 and the wall 403 from becoming coated with extraneous deposits that may be dislodged when the door 467 is moved to its open position allowing access through the opening 408.

Figure 5:
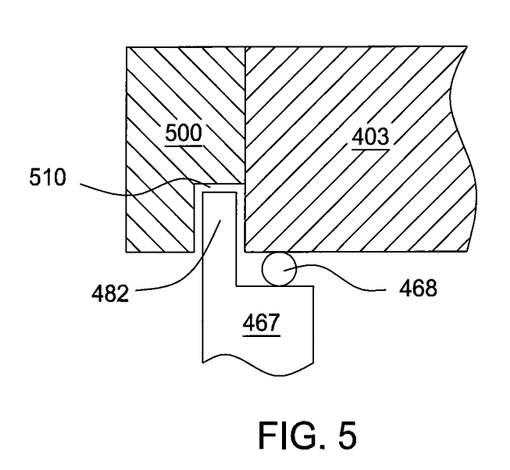
FIG. 5 is a schematic cross-section view of one embodiment of a labyrinth seal according to the present invention.
Figure 6:
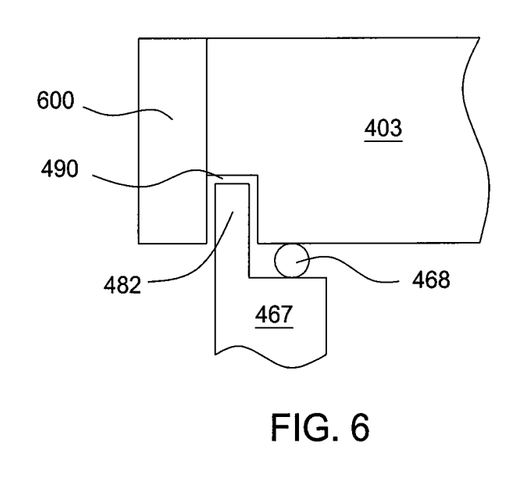
FIG. 6 is a schematic cross-section view of another embodiment of a labyrinth seal according to the present invention.

The above-reference labyrinth seal may be established with a variety of configurations of which are applicable to the present invention. For instance, the groove 452 may be formed by attaching a separate member 500, 600 to the wall 403 as shown in FIGS. 5 and 6. In FIG. 5, a recess 510 is formed in a lower surface of the member 500, which is then attached to the inner surface of the wall 403. In FIG. 6, a recess 490 is formed in the inner surface of the wall 403 and the member 600 is attached thereto.

In the embodiment depicted in FIG. 4, the chamber bottom 404, the walls 402, and the wall 403 establish an RF return path for containing the plasma 401. Additionally, the RF return path may be continued across the chamber opening 408 of the chamber wall 403 via conductive contact between the door 467 and the wall 403 on the interior of the chamber 450. This results in a significantly shorter RF return path for containing the plasma 401 at the chamber opening 408 than the configuration in prior embodiments, such as that shown in FIG. 2 for containing plasma 201 about the corresponding chamber opening 208. Preferably, the interior face 459 of the door 467 is substantially flush with the interior side of the wall 403.

As previously stated, embodiments of the present invention solve the problems associated with previous processing chamber configurations by shortening the RF return path by eliminating the elongated tunnel associated with the opening 208, 308, 408. In fact, as schematically represented in FIGS. 3 and 4, the plasma 301, 401 generated by the embodiments of the present invention is substantially uniform about the substrate 102. This substantially uniform plasma generation results in substantially uniform deposition on the substrate 102.

Correspondingly, the gas flow in the process chamber 350, 450 is substantially improved due to the elimination of the elongated tunnel at opening 308, 408. Further, the temperature distribution along chamber wall 303, 403 is substantially uniform as compared to prior embodiments. Both of these situations contribute to substantially uniform deposition onto the substrate 102.

The present embodiment also reduces production of residual process film at the opening 308, 408. In turn, this reduction substantially reduces the amount of material deposited at the opening 308, 408 as well as the potential for contamination of the substrate 102 during transfer.

It should be understood that while the foregoing embodiments depict a sliding-type closure member, a flap-type closure member that incorporates the necessary modifications associated with flap-type isolation valves may be equally applicable within certain embodiments of the present invention.

While the foregoing is directed to embodiments of the present invention, other and further embodiments of the invention may be devised without departing from the basic scope thereof, and the scope thereof is determined by the claims that follow.

The invention claimed is:

1. A processing chamber, comprising:
a chamber body having a bottom, a first wall, and a second wall, the second wall having a rear plate and a front plate, wherein facing surfaces of the rear plate and the front plate define an enclosure therebetween, wherein facing surfaces of the first wall and the front plate define a processing volume therebetween, wherein the processing volume extends to the surface of the front plate facing the rear plate, the front plate having a first opening defined between the surface of the front plate facing the rear plate and the surface facing the first wall, the opening connecting the enclosure to the processing volume, a second opening extending through the rear plate from the enclosure, wherein the first and second opening form a substrate transfer opening through the second wall, and wherein a closure member is integrated into the chamber body and disposed in the enclosure between the front plate and the rear plate of the second wall, and wherein the closure member is configured to contact the surface of the front plate facing the rear plate and seal the first opening to isolate the enclosure from the processing volume; and
a deployment mechanism configured to move the closure member with respect to the first opening.

2. The processing chamber of claim 1, wherein the closure member comprises a door member configured to contact the front plate to seal the opening and a bracing member moveable with respect to the door member configured to contact the rear plate.

3. The processing chamber of claim 2, further comprising an actuator configured to move the bracing member away from the door member and into contact with the rear plate so as to brace the door member against the front plate.

4. The processing chamber of claim 3, further comprising a conductive bumper to establish electrical contact between the door member and the front plate.

5. The apparatus of claim 1, wherein the closure member comprises resilient member.

6. The processing chamber of claim 4, such that an RF conductive path is configured to extend through the first opening, across the closure member and back through the first opening along an interior chamber surface of the first plate.

7. The processing chamber of claim 6, wherein the distance between the interior chamber surface of the first plate and the closure member is about 10 cm or less.

8. The processing chamber of claim 6, wherein the RF conductive path extending into the first opening is 10 cm or less.

9. The processing chamber of claim 6, wherein the RF conductive path extends partially through the substrate transfer opening.

* * * * *

UNITED STATES PATENT AND TRADEMARK OFFICE
CERTIFICATE OF CORRECTION

| | |
|---|---|
| PATENT NO. | : 9,458,538 B2 |
| APPLICATION NO. | : 13/349307 |
| DATED | : October 4, 2016 |
| INVENTOR(S) | : Kurita et al. |

It is certified that error appears in the above-identified patent and that said Letters Patent is hereby corrected as shown below:

In the Claims

Column 10, Line 36, Claim 5, delete "apparatus" and insert -- processing chamber --, therefor.

Signed and Sealed this
Third Day of January, 2017

Michelle K. Lee
*Director of the United States Patent and Trademark Office*